US008824200B1

(12) United States Patent
Edelstein

(10) Patent No.: US 8,824,200 B1
(45) Date of Patent: Sep. 2, 2014

(54) NONVOLATIVE MEMORY CELLS PROGRAMABLE BY PHASE CHANGE

(71) Applicant: U.S. Army Research Laboratory, Adelphi, MD (US)

(72) Inventor: Alan S. Edelstein, Alexandria, VA (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 14/109,398

(22) Filed: Dec. 17, 2013

(51) Int. Cl.
*G11C 11/00* (2006.01)
*H01L 27/22* (2006.01)
*G11C 11/16* (2006.01)

(52) U.S. Cl.
CPC .............. *G11C 11/161* (2013.01); *H01L 27/22* (2013.01)
USPC ............ 365/158; 365/171; 365/173; 365/148

(58) Field of Classification Search
CPC ...... H01L 43/08; G11C 11/16; G11C 11/161; G11C 11/15; G11C 11/5607
USPC ................................. 365/158, 171, 173, 148
See application file for complete search history.

(56) References Cited

U.S. PATENT DOCUMENTS

| | | | |
|---|---|---|---|
| 5,204,192 | A | 4/1993 | Nakamura et al. |
| 5,610,106 | A | 3/1997 | Foster et al. |
| 6,947,319 | B1 | 9/2005 | Edelstein |
| 7,038,942 | B2 * | 5/2006 | Ohmori .......................... 365/173 |
| 7,046,002 | B1 | 5/2006 | Edelstein |
| 7,233,142 | B1 | 6/2007 | Edelstein |
| 8,222,898 | B1 | 7/2012 | Edelstein |
| 8,391,053 | B2 * | 3/2013 | Prejbeanu et al. ............ 365/158 |
| 2008/0102320 | A1 | 5/2008 | Edelstein |
| 2014/0043709 | A1 | 2/2014 | Edekstein |
| 2014/0043891 | A1 | 2/2014 | Edelstein |

OTHER PUBLICATIONS

Lai, S, et al., "OUM—A 180 nm Nonvolatile Memory Cell Element Technology for Stand Alone and Embedded Applications" Intel Corporation, RN3-0 1 2200 Mission College Blvd Santa Clara, CA 95052-8 119, DOI:10.1109/IEDM.2001.979636 in proceeding of: Electron Devices Meeting, 2001. IEDM Technical Digest. International, IEEE Explore (2001).

Takaura, N, "A GeSbTe Phase-Change Memory Cell Featuring a Tungsten Heater Electrode for Low-Power, Highly Stable, and Short-Read-Cycle Operations," Electron Devices Meeting, 2003. IEDM '03 Technical Digest. IEEE International, pp. 37.2.1-37.2.4, Date of Conference: Dec. 8-10, 2003.

(Continued)

*Primary Examiner* — David Lam
(74) *Attorney, Agent, or Firm* — Lawrence E. Anderson

(57) ABSTRACT

An array of memory cells, each cell comprising a first and second ferromagnetic layers that form either a spin valve or a magnetic tunnel junction; at least one conductor operatively connected to at least one of the first and second ferromagnetic layers; a third ferromagnetic layer magnetically coupled to the second magnetic layer having permittivity which changes from a first state to a second state of lower permittivity upon heating; the second ferromagnetic layer being influenced by the permittivity of the third ferromagnetic layer; and a heater element operatively associated with the third magnetic layer which selectively provides heat to the third magnetic layer to change its permittivity. An alternate embodiment comprises an array of cells, each cell comprising a ferromagnetic region having permittivity which changes from a first state to a second state upon heating and a heater operatively which selectively provides heat to the third magnetic layer.

20 Claims, 8 Drawing Sheets

(56) References Cited

OTHER PUBLICATIONS

Guler, Urcan, et al., "Local Heating with Lithographically Fabricated Plasmonic Titanium Nitride Nanoparticles," American Chemical Society Publications, Nano Lett., 2013, 13 (12), pp. 6078-6083, DOI: 10.1021/nl4033457 Publication Date (Web): Nov. 26, 2013.

Takemura, R., et al. 2Mb SPRAM Design: Bi-Directional Current Write and Parallelizing-Direction Current Read Schemes Based on Spin-Transfer Torque Switching, IEEE Journal of Solid-State Circuits, vol. 43, No. 1, Jan. 2008.

Kawahara, T., et al., "Spin-transfer torque RAM technology: Review and prospect," Microelectronics Reliability 52 (2012) 613-627.

Worledge, D.C., et al., "Spin torque switching of perpendicular Ta CoFeB MgO-based magnetic tunnel junctions," Applied Physics Letters 98, 022501; doi: 10.1063/1.3536482 (2011).

* cited by examiner

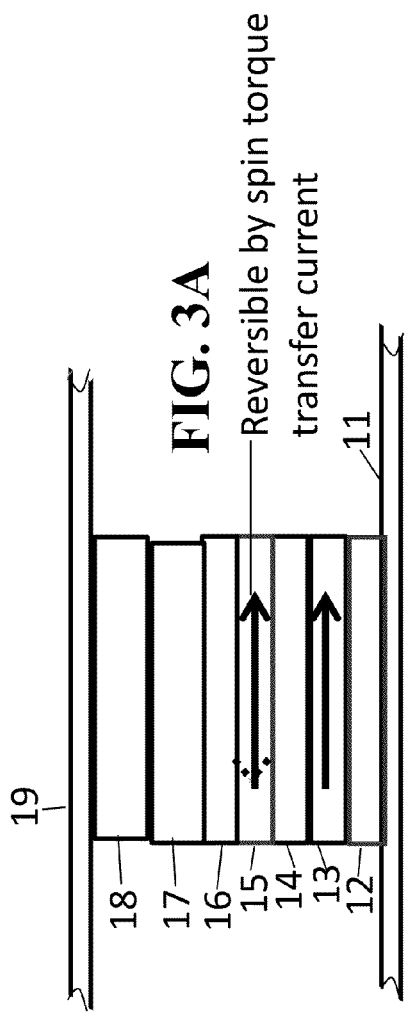
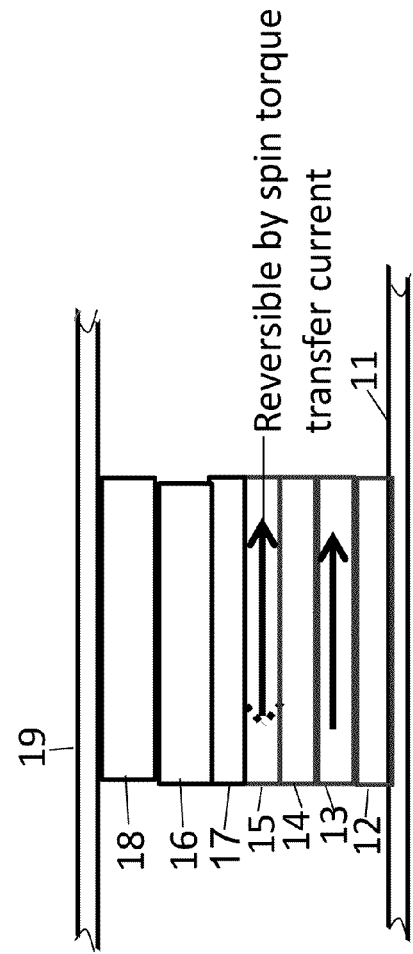

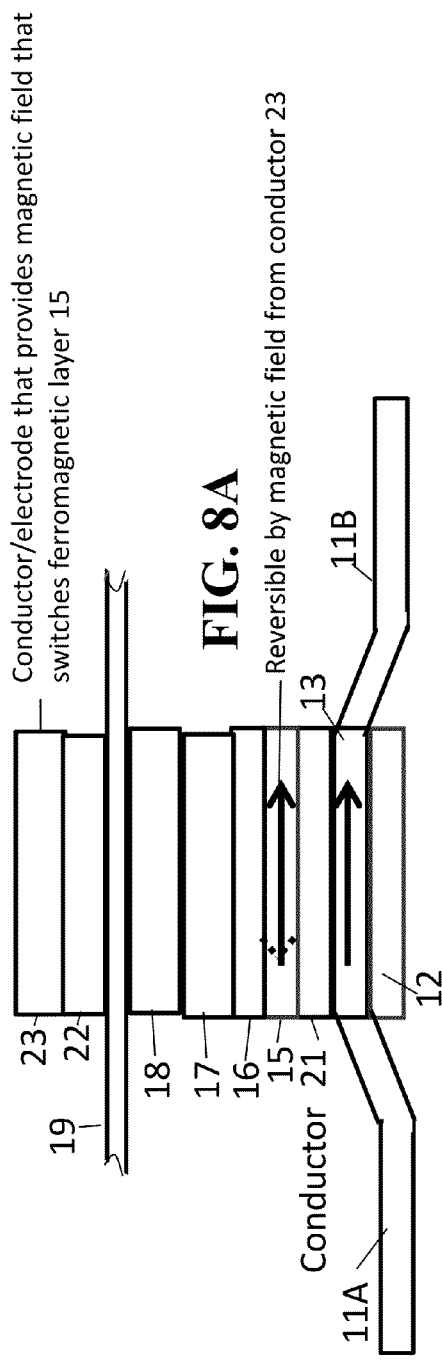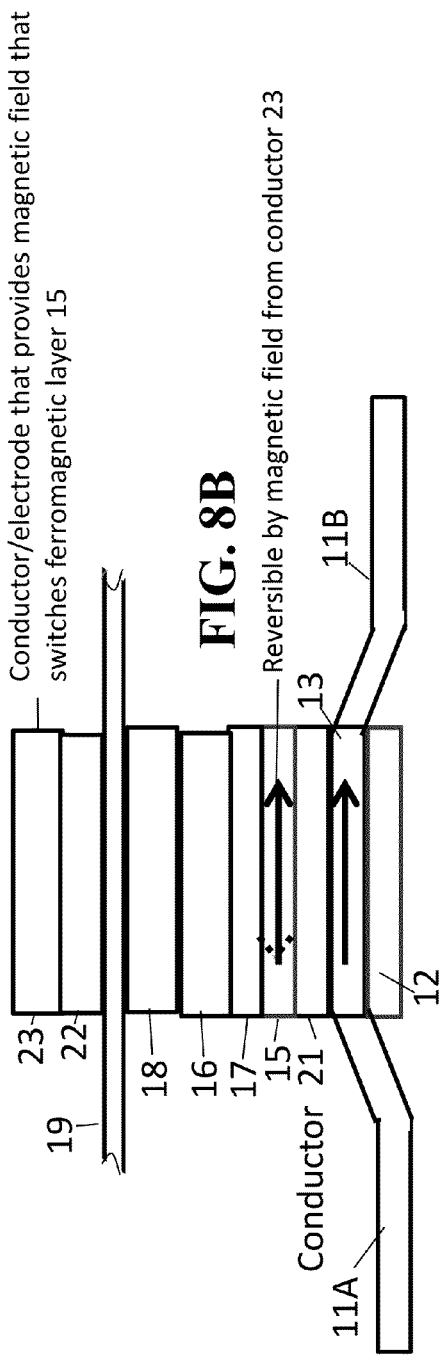

NONVOLATIVE MEMORY CELLS PROGRAMABLE BY PHASE CHANGE

STATEMENT OF GOVERNMENT INTEREST

The invention described herein may be manufactured, used, and licensed by or for the United States Government without the payment of royalities.

BACKGROUND OF THE INVENTION

As reported in Takemura, et al., "2 Mb SPRAM Design: Bi-Directional Current Write and Parallelizing-Direction Current Read Schemes Based on Spin-Transfer Torque Switching," IEEE (2007) (Takemura, et al.), magnetic tunnel junction with MgO tunneling barrier which offers the resistance ratio of "1" state to "0" state—Tunnel Magneto-Resistance, (TMR ratio)—over 100% (up to 472%) and reduced threshold current (write current) density under 500 uA per cell (down to 100 µA), has made the spin-transfer torque writing type memory a viable and serious candidate for low power non-volatile RAM, or universal memory. According to Takemura, et al., however, there are few reports of circuits and memory-array technology which are appropriate for spin-transfer torque writing and its related reading schemes.

The spin transfer torque [STT] process is reported in Kawahara, T., el al., "Spin-transfer Torque RAM: Review and Prospect," Micoelectronics Reliability, 52 (2012) 613-627 (herein incorporated by reference) occurs when electrons flow from a pinned layer to a free layer. After electrons pass through the pinned layer, the electrons with the same spin direction as that of the magnetization in the pinned layer mainly remain and the current is spin-polarized. This spin-polarized current exerts STT on the magnetization of the free layer, and when the amount of spin-polarized current exceeds the threshold value, the magnetization of the free layer is switched. In parallel (P) to antiparallel (AP) switching, electrons should flow from the free layer to the pinned layer. After electrons pass through the free layer, the electrons with the same spin direction as that of the magnetization in the pinned layer pass through that layer. However, the electrons with the opposite spin direction is reflected at the boundary between an MgO barrier and the pinned layer and injected into the free layer. This current exerts STT on the magnetization of the free layer, and when the amount of the spin-polarized current exceeds the threshold value, the magnetization of the free layer is switched. In the read operation, the signal voltage in a sense amplifier is defined by the resistance difference between the parallel and antiparallel states and the amount of read current.

It is known that programming of memory cells can be accomplished by changing the phase of materials, i.e., from amorphous to crystalline state. The publication entitled "OUM—A 180 nm Nonvolatile Memory Cell Element Technology For Stand Alone and Embedded Applications" by Stefan Lai, et al., Intel Corp., Santa Clara, Calif., February 2001, Proceedings of: Electron Devices Meeting, 2001, IEDM Technical Digest International, IEEE Xplore (2001), herein incorporated by reference, discusses the development status of the memory cell element of OUM (Ovonic Unified Memory)—a chalcogenide based, phase-change nonvolatile, semiconductor memory technology involving phase changing materials. OUM is a nonvolatile memory that utilizes a reversible structural phase change between amorphous and polycrystalline states in a GeSbTe chalcogenide alloy material. Because of the very small size, temperature steps required to form the elements do not compromise transistor performance, During the amophizing reset pulse, the temperature of the programmed volume of phase-change material exceeds the melting point which eliminates the polycrystalline order in the material. The crystallizing set pulse is of lower amplitude and sufficient duration (12-50 ns) to maintain device temperature in the rapid crystallization range for a time sufficient for crystal growth.

The publication entitled "A GeSbTe Phase-Change Memory Cell Featuring a Tungsten Heater Electrode for Low-Power, Highly Stable, and Short-Read-Cycle Operations" by N. Takaura, et al, International Electron Devices Meeting; IEEE, 897-900 (2003) (ISBN 0780378725) (herein incorporated by reference, features a Germanium-Antimony-Tellurium (GeSbTe) memory cell with a tungsten heater electrode. The cell has a reset current (50 PA) for the phase-change memory device.

SUMMARY OF THE INVENTION

A preferred embodiment memory device comprising an array of cells, each cell comprising a first ferromagnetic layer with a fixed magnetic polarity; a second ferromagnetic layer with a magnetic polarity modifiable by a spin torque transfer current; at least one conductor operatively connected to the first and second ferromagnetic layers; a barrier layer between the first and second ferromagnetic layers forming a magnetic tunnel junction; a third ferromagnetic layer magnetically coupled to the second magnetic layer; the third magnetic layer having tunable permitivity; a heater element operatively associated with the third magnetic layer which selectively provides heat to the third ferromagnetic layer; the third ferromagnetic layer having a first permeable amorphous state; the third ferromagnetic layer capable of being heated to a second state which is crystalline to thereby decrease the permittivity of the third magnetic layer; whereby changes in the permittivity of the third magnetic layer effect the response of the second ferromagnetic layer to a spin polarized current.

Optionally, the array of cells are used to store data and each cell has four states, each state being determined by the magnetic polarities of the first and second ferromagnetic layers and the permittivity of the third ferromagnetic layer. Optionally, each memory cell is configured such that if the magnetic polarities of the first and second ferromagnetic layers are antiparallel, the at least one conductor operatively connected to the first and second ferromagnetic layers provides a spin polarized current as the current passes through the first ferromagnetic layer and into the second ferromagnetic layer which provides a spin transfer torque current to the second ferromagnetic layer which causes the magnetic polarity of the second ferromagnetic layer to change from a first state of which is substantially antiparallel to the magnetic polarity of the first ferromagnetic layer to a second state which is substantially the same or parallel to the magnetic polarity of the first ferromagnetic layer, and if the first and second ferromagnetic layers are parallel, the at least one conductor operatively connected to the first and second ferromagnetic layers provides a spin polarized current as the current passes through the second ferromagnetic layer and is partially reflected back into the second ferromagnetic layer which provides a spin transfer torque current to the second ferromagnetic layer which causes the magnetic polarity to change from a first state which is substantially parallel to the magnetic polarity of the first magnetic layer to a second state which is substantially opposite to the magnetic polarity of the first magnetic layer.

Optionally, the memory device further comprises read circuitry operative to determine whether the modifiable magnetic polarity of the second ferromagnetic layer is substantially parallel to the magnetic polarity of the first ferromagnetic layer or is substantially opposite to the magnetic polarity of the first ferromagnetic layer. In addition, the read circuitry may operate to determine whether the third ferromagnetic layer is in a first highly permeable amorphous state or a second crystalline state. Optionally, the device comprises first and second conductors and the read circuitry is operatively connected to the first and second conductors. Whether or not the magnetic polarity of the second ferromagnetic layer is substantially parallel to the magnetic polarity of the first ferromagnetic layer or substantially opposite to the magnetic polarity of the first ferromagnetic layer is determined by applying at least one pulse to the first and second conductors.

Optionally, the memory device comprises a voltage detector and the memory cells have a plurality of memory states, at least one memory state of each cell being determined by transmitting current pulses between the first and second conductors. If the resistance is low the magnetic polarity of the first and second ferromagnetic layers is substantially parallel in state and if the resistance is high then the magnetic polarity of the first and second ferromagnetic layers is substantially opposite. Furthermore, the memory cells may have four states based upon whether the first and second ferromagnetic layers are parallel or antiparallel and whether the third ferromagnetic layer has a first permeable amorphous state or a second state which is crystalline. The state of the third ferromagnetic layer may be determined by initiating pulses between the first and second conductors that are large enough to switch the second ferromagnetic layer if the third magnetic layer is in the first state but not if the third magnetic layer is it is in a second state.

Optionally, the memory device comprises a magnetic field probe and a detector of resistance to determine the states of the array of memory cells.

The third magnetic layer may comprise one of a Cu/Ni bilayers, Metglas, and alternating layers of copper and nickel.

An alternate preferred embodiment comprises an array of memory cells, each cell comprising a first ferromagnetic layer with a fixed magnetic polarity; a second ferromagnetic layer with a magnetic polarity modifiable by a spin torque transfer current; at least one conductor operatively connected to the first and second ferromagnetic layer and adapted to be connected to a current source; a third ferromagnetic layer magnetically coupled to the second magnetic layer; the third magnetic layer having permittivity which changes from a first state to a second state of lower permittivity upon heating; the second ferromagnetic layer being influenced by the permittivity of the third ferromagnetic layer whereupon application of a spin transfer torque current to the second ferromagnetic layer when the third ferromagnetic layer is in the second state will require a greater amount of spin transfer torque current to effectuate a change in the magnetic polarity of the second ferromagnetic layer than that which occurs when the third ferromagnetic layer is in the first state; and a heater element operatively associated with the third magnetic layer which selectively provides heat to the third magnetic layer to change its permittivity. The third ferromagnetic layer changes from the first state of permittivity to a second state of permittivity in which is the third ferromagnetic layer is substantially crystalline in structure. As a further option, the third ferromagnetic layer may be in direct contact with the second ferromagnetic layer and affects the second ferromagnetic layer due to exchange interactions.

An alternate preferred embodiment comprises an array of cells, each cell comprising a first ferromagnetic layer with a fixed magnetic polarity; a second ferromagnetic layer with a magnetic polarity modifiable by a magnetic field; the second ferromagnetic layer being separated from the first ferromagnetic layer by a conductor layer; at least one conductor operatively connected to the first and second ferromagnetic layers; a third magnetic layer magnetically coupled to the second magnetic layer; the third magnetic layer having tunable permittivity; a heater element operatively associated with the third magnetic layer which selectively provides heat to the third magnetic layer; the third magnetic layer having a first state that is a highly permeable amorphous state; the third layer capable of being heated to a second state which is crystalline to thereby decrease the permittivity of the third magnetic layer; the second ferromagnetic layer being influenced by the decrease in permittivity of the third magnetic layer such that application of larger magnetic field will be required to change the magnetic polarity of the second ferromagnetic layer when the third magnetic layer is in the second state than that needed when the third magnetic layer is in the first state. In addition, the first and second ferromagnetic layers with the conductor layer may form a spin valve and the state of the device may be read by measuring the resistivity of the spin valve.

An alternate preferred embodiment comprises an array of cells, each cell comprising a ferromagnetic region having permittivity which changes from a first state to a second state of lower permittivity upon heating; a heater operatively associated with the ferromagnetic region which selectively provides heat to the third magnetic layer to change its permittivity; and a plurality of conductors operatively connected to the heater and adapted to be connected to a current source that provides a current which causes the heater to emit heat to change from ferromagnetic region from a first state to a second state.

BRIEF DESCRIPTION OF THE DRAWINGS

The foregoing and other objects, features, and advantages of the invention will be apparent from the following more detailed description of the preferred embodiments of the invention, as illustrated in the accompanying drawings, wherein:

FIG. 3A is a schematic side view of the preferred embodiment memory cell 10 of FIG. 2 illustrating the multilayer structure in the 4 state STT RAM device.

FIG. 3B is a schematic side view of an alternate preferred embodiment memory cell 10A.

FIG. 8A is an alternate embodiment incorporating a spin valve configuration wherein the tuneable permittivity layer 17 is spaced from the second ferromagnetic layer 15

FIG. 8B is an alternate embodiment incorporating a spin valve configuration wherein the tuneable permittivity layer 17 is in contact with the second ferromagnetic layer 15

Figure 1:
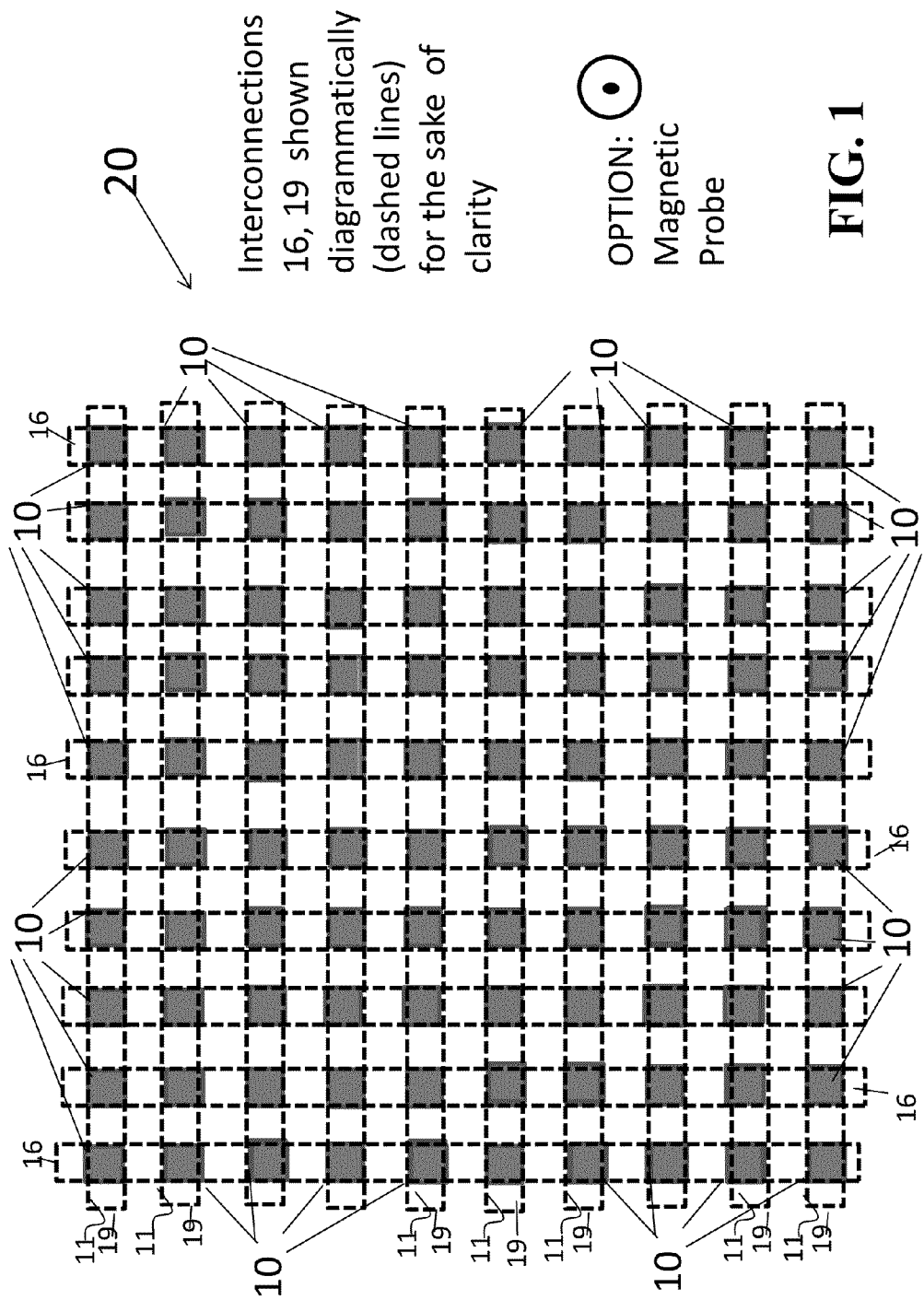
FIG. 1 is a schematic illustration of a 10×10 array 20 of memory cells 10 each one of which can be written by sending a current through the appropriate combination of horizontal and vertical connecting electrodes.

A more complete appreciation of the invention will be readily obtained by reference to the following Description of the Preferred Embodiments and the accompanying drawings in which like numerals in different figures represent the same structures or elements. The representations in each of the figures are diagrammatic and no attempt is made to indicate actual scales or precise ratios. Proportional relationships are shown as approximates.

DESCRIPTION OF THE PREFERRED EMBODIMENTS

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention. Rather, these embodiments are provided so that this disclosure will be thorough and complete, and will fully convey the scope of the invention to those skilled in the art. In the drawings, the dimensions of objects and regions may be exaggerated for clarity. Like numbers refer to like elements throughout. As used herein the term "and/or" includes any and all combinations of one or more of the associated listed items.

The terminology used herein is for the purpose of describing particular embodiments only and is not intended to limit the full scope of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as an object, layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions, layers and/or sections, these elements, components, regions, layers and/or sections should not be limited by these terms. For example, when referring first and second elements, components, regions, layers and/or sections, these terms are only used to distinguish one element, component, region, layer or section from another region, layer or section.

Furthermore, relative terms, such as "lower" or "bottom" and "upper" or "top," may be used herein to describe one element's relationship to other elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. Furthermore, the term "outer" may be used to refer to a surface and/or layer that is farthest away from a substrate.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region or object illustrated as a rectangular will, typically, have tapered, rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will also be appreciated by those of skill in the art that references to a structure or feature that is disposed "adjacent" another feature may have portions that overlap or underlie the adjacent feature.

Figure 2:
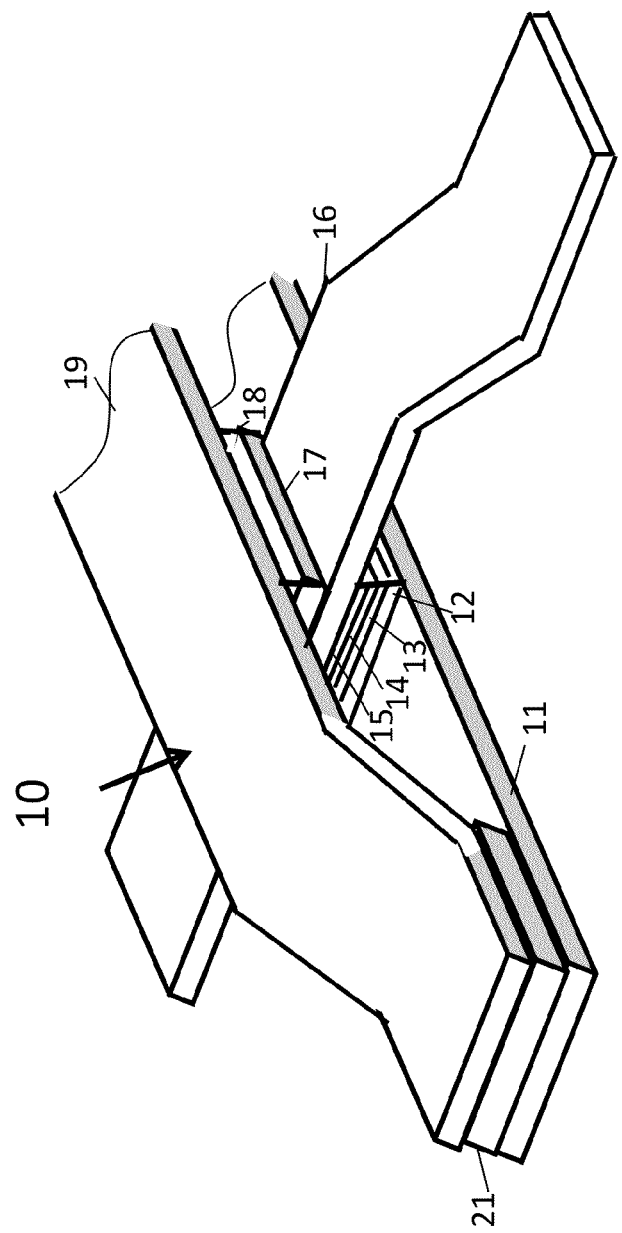
FIG. 2 is a schematic illustration of a memory cell 10 of FIG. 1.

The present invention provides a technique of adding to a spin transfer torque (STT) RAM that makes it such that it can be in four possible states and a method for fabricating a two state nonerasable memory on a 40 nm scale. Referring to FIG. 1, shown is an array 20 of memory cells 10 interconnected by connections 16, 19 and 11 (lying beneath 19 and not visible). Electrodes 11 and 16 are used with the STT RAM portion of the device. Electrodes 16 and 19 are used to power the heater. E-beam lithography may be used to fabricate the devices and each memory cell can be 40 nm in both width and length. It can be appreciated by those of ordinary skill in the art that the read/write portions of cells 10 are addressed for both reading and writing through connections 16 and 11, that is the lower portion of the memory cell 10 as shown in FIGS. 2 and 3 can be changed by applying current through row (horizontal) and column (vertical) lines 11 and 16, respectively. The ROM portion of the memory cell 10 comprises a heating element 18 which, upon ohmic heating, changes the ferromagnet with tunable permeability 17. The heating element 18 can be made out of titanium nitride. The ROM portion of the memory cell 10 is addressed via electrodes (or lines) 16 and 19. That is, by applying current through lines 16 and 19, heat is generated in heater 18, for example, the heating element in the embodiment shown in FIGS. 2 and 3 reaches a temperature of approximately 400° C. Depending upon design, this may be a one-time occurrence as, after application of heat through heater 18, the tunable ferromagnetic portion with tunable permeability 17 has its permeability changed irreversibly. With a different optional design that allows for heating to higher temperatures and faster cooling, the tunable portion can revert to its original permeability. The tunable permeability portion 17 may comprises soft magnetic material, e.g., Metglas, that has a high magnetic permeability when it is amorphous and a low magnetic permeability when it is crystalline. The horizontal and vertical electrodes 19, 16, respectively, will pass the current through the heating element associated with a particular bit. By passing a current through the heater 18, and by adjusting the magnitude of the current, one can raise the temperature of the soft magnetic material above its glass temperature. The time dependence of the pulse is also important. If the pulse turns off in millisecond, the soft magnetic material cools and will crystallize and have a lower permeability. If the heat melts the Metglas and the pulse turns off in microseconds, the soft magnetic material cools quickly and will revert to being amorphous and have a large permeability.

In other words, if the cooling is slow, the read-only, upper portion of the memory cell 10 retains its crystalline state (programming capability to a one or zero) irrespective of whether a current is applied thereafter, similar in effect to a write once, read only memory comprising 40 nm non-erasable bits. Operatively associated with the upper portion read-only portion of memory cell is the lower read-write portion of memory cell 10, as illustrated in FIGS. 2 and 3, positioned between electrodes 11 and 16, each one of which can be written by sending a current through the appropriate combination of horizontal and vertical connecting electrodes. The read-write portion of cell 10 comprises a synthetic antiferromagnet 12, a fixed or pinned ferromagnet layer 13, an oxide layer 14 and a free ferromagnet layer 15. As used herein, the terminology "ferromagnetic" refers to substances that are ferromagnetic; such as for example, iron, nickel, cobalt and most of their alloys, some compounds of rare earth metals, and a few naturally-occurring minerals such as lodestone.

The basic structure of the device is a combination of a read only memory and a spin transfer torque (STT) random access memory (RAM). In a spin transfer torque (STT) random access memory (RAM), the free layer 15 has two basic states that depend on whether the magnetization of the free layer 15 is parallel or antiparallel to the magnetization of the fixed layer 13. When the two layers 13, 15 are antiparallel the resistance is typically 100% higher than when they are parallel. The basic configuration of the free layer's (15) magnetization parallel or antiparallel with respect to the fixed layer's (13) magnetization is determined by passing a sufficiently large spin polarized current density between the fixed layer 13 and the free layer 15. Typically this requires a spin polarized density of $10^6$ amps/cm². If this current is from the fixed layer 13 to the pinned layer 15, it will tend to make the two layers parallel. If the current is in the opposite direction, it will tend to make the two layers antiparallel.

There are several possible configurations of the memory cell 10, which divide into two classes. In the first class, the tunable ferromagnet 17 is not in direct contact with the free layer 15. In this case, the tunable ferromagnet affects the free layer via its magnetostatic field. This type of configuration is illustrated in FIG. 3A. In the second class, the tunable ferromagnet 17 is in direct contact and it affects the free layer 15 via its exchange field. This configuration is illustrated in FIG. 3B. The two configurations differ only in that the positions of the tunable ferromagnetic 17 and electrode 16 are interchanged. The exchange field, which occurs when the free ferromagnetic layer 15 and the tunable ferromagnetic layer 17 are in contact and will usually provide a stronger interaction than the magnetostatic field.

In FIG. 3A, all the structure starting from the lowermost layer 11 to the free ferromagnetic layer 15 comprises the structure of a standard STT RAM device. The structure above the free layer 15 comprises the tunable permeability layer 17 that is coupled magnetically by the magnetostatic field to the free ferromagnetic layer 15 of the STT RAM. As discussed above, a current through the heater 18 can be used to modify the permeability of the tunable permeability layer 17. Also again a current between the free layer 15 and the pinned layer 13 can be used to switch the direction of the magnetization of the free layer 15. The permeability of the tunable layer 17 affects the free layer 15. Specifically, the behavior of two basic states, free layer parallel or antiparallel to the fixed layer, becomes dependent on whether the tunable permeability layer 17 is crystalline or amorphous.

Tunable layer 17 is a ferromagnetic material whose permeability may be changed by heating, As a result of the changeable natures of the tunable permeability layer 17, the cell 10 may have one of 4 states at a given time. The following is a description of the two ways of reading these 4 states.

Method of Reading the States with an Applied Field

Figure 4:
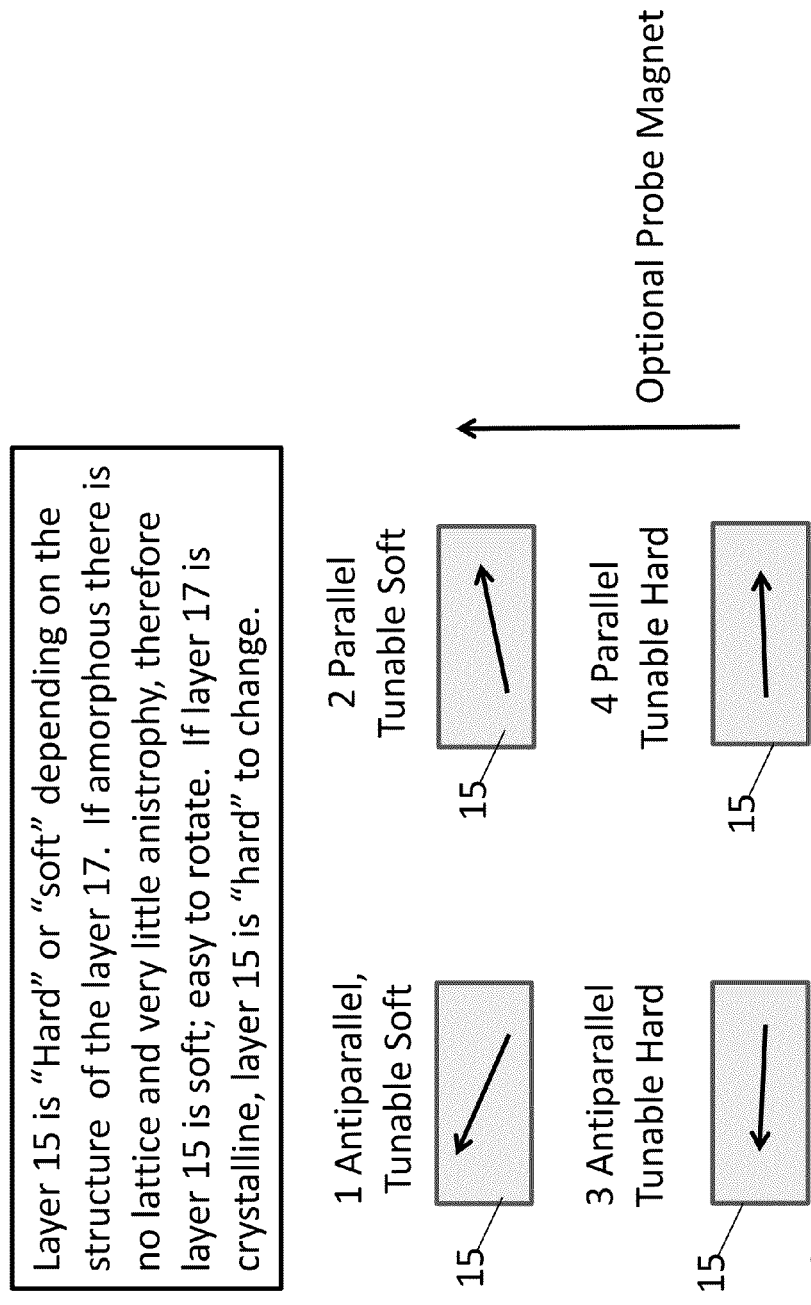
FIG. 4 is an illustration of the 4 orientations of the free layer 15 in response to an applied field in each of the 4 states.
Figure 5:
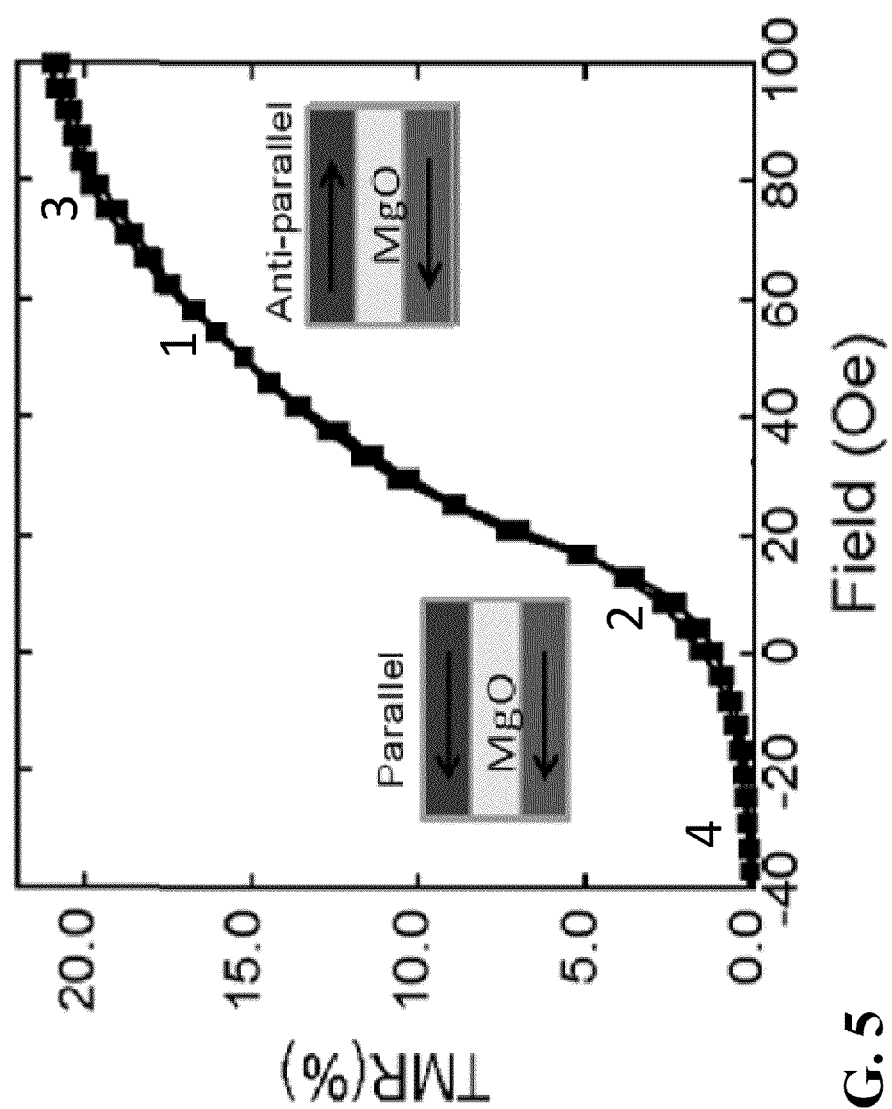
FIG. 5 is an illustration showing typical magnetoresistance characteristics of a magnetic tunnel junction and the values of resistance for the four states depicted in FIG. 4.

In this case, a magnetic tunnel junction (MTJ) reader, as described in U.S. patent application Ser. No. 13/725,473, filed Dec. 12, 2012, entitled Nonvolatile Corruption Resistent Magnetic Memory and Method Thereof," herein incorporated by reference, is sensitive to the modification of a probe magnetic field caused by changes in the permeability of small regions. In our device, if there is an applied field, it will affect the orientation of the magnetization of both the tunable permeability layer and the free layer. The response of the tunable layer to an applied field will depend on whether it is crystalline or amorphous. The response of the free layer and hence the magnetoresistance of the device will depend upon both the applied field and the permeability of the tunable permeability layer. The reason that the response of the free layer depends on the permeability of the tunable layer is that the two layers are coupled either by exchange coupling at their mutual interface (as in FIG. 3B) or by the magnetostatic field when they are separated by conductor 16 as in FIG. 3A. If the tunable layer is crystalline, then the tunable layer 17 and also the free layer 15 will be also less responsive to the spin polarized current. The 4 orientations of the free layer 15 in response to a magnetic field in each of the 4 states are depicted in FIG. 4. The following is a description of the way these states are created: The tunable permeability layer 17 is initially soft but can be made hard by passing a large current through the heater element 18. For example, if the layer 17 is Metglas, heating it above its glass temperature of about 400° C. will crystallize it. If the tunable permeability layer 17 is in its high permeability state, it will be affected more by the probe field and will tend to rotate the magnetization of the free layer because of the coupling between free layer 15 and the tunable permeability layer 17. If the tunable permeability layer 17 is in its low permeability state, it will be affected less by the probe field and it will have a smaller tendency to rotate the magnetization of the free layer. The response to the probe field and hence the states can be read by passing a small constant current through the magnetic tunnel junction and measuring the voltage. The current must be small enough that it does not change the magnetization of the free layer 15 or crystallize the tunable permeability layer 17. This requirement will be easily satisfied. The magnetoresistance and resistance values of these four states for a typical magnetic tunnel junction are shown in FIG. 5.

Method of Reading the States with Three Read Pulses.

Figure 6:
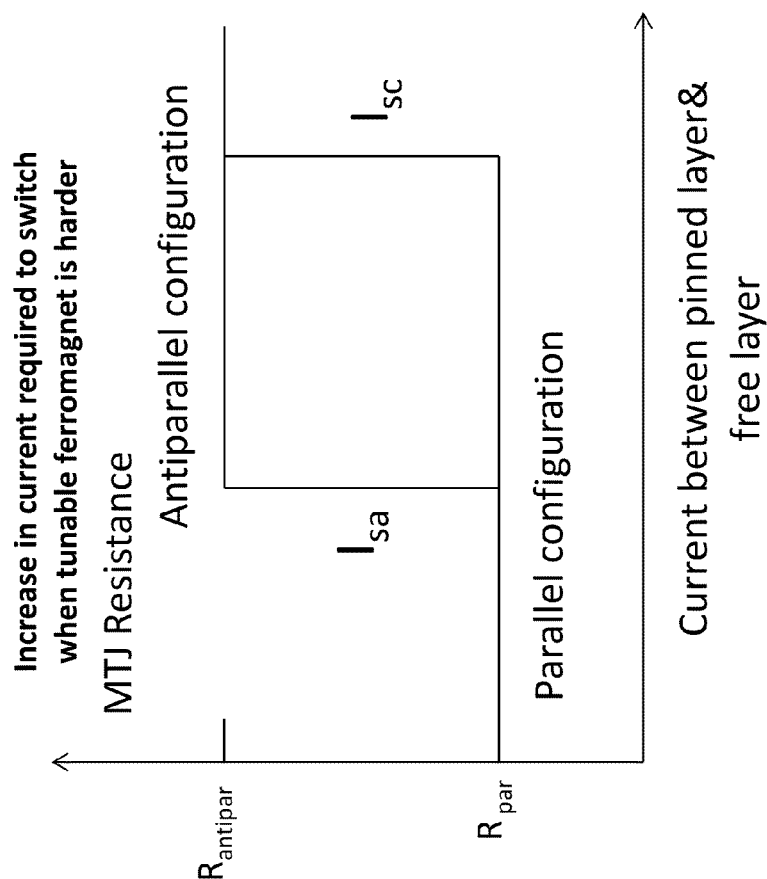
FIG. 6 is an Illustration of how different currents are needed to switch the free layer 15 if the tunable permeability layer 17 is crystalline or amorphous. $I_{sa}$ and $I_{sc}$ are the switching currents if the tunable permeability layer is amorphous or crystalline, respectively.

The state of the device is can also be read by applying multiple current pulses between electrodes 11 and 16. Generally, no magnetic field is required in this reading process. There are 4 possible states that depend on whether the free layer is parallel or antiparallel to the fixed layer and whether the tunable layer is soft or hard. The four states are: 1 parallel hard, 2 parallel soft, 3 antiparallel hard, 4 antiparallel soft. As discussed above the tunable layer can be made hard by applying current heating pulses between electrodes 16 and 19. It is considerably more difficult to change back and convert the tunable layer soft again because one has to melt it and quench it very rapidly. States 1 and 2 have the same resistance and are low resistance states. States 3 and 4 have the same resistance and are high resistance states. When the tunable layer 17 is hard (after crystallization) and has a larger coercivity, it takes a larger current to switch the magnetization of the free layer. This difference in the current required to switch the free magnetic layer 15 is illustrated in FIG. 6. $I_{sa}$ is the switch current need to switch the free magnetic layer 15 when the tunable layer 17 is soft and $I_{sc}$ is the current required to switch the free magnetic layer 15 when the free magnetic layer 15 is hard.

Determining the state of the device is done as follows and the reading procedure or process is summarized in the truth table depicted below for both of embodiments of FIGS. 3A and 3B.

A. First pulse. A low current read pulse is applied that cannot switch the configuration of the free layer 15 and the resistance is measured to determine whether the free layer and pinned layer are in the parallel or antiparallel configuration. If the resistance is low then the device was originally in state 1 (parallel-hard) or 2 (parallel-soft). If the resistance is high then the device was originally in state 3 (antiparallel-hard) or 4 (antiparallel-soft).

B—Second Pulse. Based on the knowing the result from the first pulse, a second pulse is applied that is large enough to switch free layer 15 if the tunable layer 17 is in its high permeability or soft state (amorphous) but not if it is in its low permeability or hard state (crystalline), i.e., apply a current I satisfying $I_{sa}<I<I_{sc}$. Although if the tunable layer 17 is in the amorphous or soft state this pulse will switch the free ferromagnetic layer from the one of antiparallel or parallel configurations to one of the parallel or antiparallel configurations, another pulse is needed to determine if the switching has occurred.

C—Third pulse—A low current read pulse is applied that cannot switch the configuration of the free layer 15 and the resistance is measured to determine whether the free layer 15 has been switched or not. The first and third pulses may be substantially identical in terms of current amplitude. As in the case of the first pulse, if the resistance is low (states 1 or 2), the magnetic polarity of the free ferromagnetic layer 15 is parallel to the magnetic polarity of fixed ferromagnetic layer 13. If the free ferromagnetic layer 15 was determined to be in a low resistance state as a result of the first pulse measurement and the $2^{nd}$ pulse did not cause switching, then the cell was in a state where the ferromagnetic layer 15 is parallel to the magnetic polarity of ferromagnetic layer 13 and the tunable layer 17 was in the hard (crystalline state), then it has been determined that the system was originally in state 1. If the free ferromagnetic layer 15 was determined to be in a low resistance state as a result of the first pulse measurement and the $2^{nd}$ pulse did cause switching, then the cell is now in a state where the ferromagnetic layer 15 is anti-parallel to the magnetic polarity of ferromagnetic layer 13 and the tunable layer 17 is determined to be in soft (amorphous) state. Thus the cell was originally in state 2.

Similarly, if the resistance after the first pulse was high, then the magnetic polarity of the free ferromagnetic layer 15 is anti-parallel to the magnetic polarity of ferromagnetic layer 13, which means that the cell was originally in states 3 or 4. Based upon the result in step A, a comparison can be made to determine whether or not a change in the magnetic polarity of the ferromagnetic layer 15 has occurred upon application of the second pulse in Step B. If step A determined the magnetic polarities to be anitiparallel and if Step C reveals that the magnetic polarities are still anti-parallel, then pulse of Step B did not switch it, then tunable layer 17 is determined to be hard and the original state is determined to be state 3. If step A determined the magnetic polarities to be anti-parallel and if Step C reveals that the magnetic polarities are parallel, then pulse of Step B did switch the ferromagnetic layer 15, and then tunable layer 17 is determined to be soft and the original state is determined to be state 4.

Accordingly, in the case of both the embodiments in FIGS. 3A and 3B, if a switch of the magnetic polarity has occurred in step B, then the state of the tunable ferromagnetic layer 17 is determined to be soft and the states are either state 2 or 4. If a switch has not occurred, then the state of the tunable ferromagnetic layer 17 is determined to be hard (either state 1 or 3). The possibilities are listed in the Truth Table.

Truth Table to Determine Magnetic State After Applying three Pulses.

| Pulse | Effect and/or State | | Effect and/or State | |
| --- | --- | --- | --- | --- |
| 1. Low current read pulse | Resistance R low State 1 or 2 | | Resistance R high State 3 or 4 | |
| 2. Current pulse, $I_{sa} < I < I_{sc}$ | Switch | Not Switch | Switch | Not Switch |
| 3. Low current read pulse | State 4, originally in State 2 | State 1 originally in State 1 | State 2 originally in State 4 | State 3 originally in State 3 |

FIG. 6 is an illustration of how different currents are needed to switch the free layer if the tunable permeability layer is crystalline or amorphous. $I_{sa}$ and $I_{sc}$ are the switching currents if the tunable permeability layer is amorphous or crystalline, respectively. As shown in FIG. 2, the current pulses will be applied via the conductors 19 and 16, respectively.

A phase changing operation (akin to tuneable permeability) was described in 'GeSbTe Phase-Change Memory Cell Featuring a Tungsten Heater Electrode for Low-Power, Highly Stable, and Short-Read-Cycle Operations" by N. Takaura, et al., herein incorporated by reference. A phase-change from an amorphous state to a crystal state was defined by a DC switching voltage, $V_{switch}$ and a DC switching current, $I_{switch}$. The DC "switching" voltage and current are related to the power per unit volume required for the phase-change, p;

$$P = \frac{I_{switch}V_{switch}}{A \cdot T} = \frac{V_{switch}^2}{R \cdot A \cdot T} = \frac{V_{switch}^2}{\rho \cdot T^2}$$

where A is sample area, T is sample thickness, R is sample resistance, and ρ is sample resistivity. One of ordinary skill in the art could determine the appropriate current/power requirements utilizing the above equation.

Calculations have been done required to heat a 40×40×20 nm volume layer 17 using a TiN heater to 400 C in 1 mil sec. Neglecting heat loss due to conduction and convection, an order of magnitude estimate would be that it will take on the order of 1 micro amp.

Alternate Embodiment/Method for Rewriting the Bits

By controlling the temperature of the chip and pulse shape of the current used for writing one can facilitate the writing process and possibly cool the chip quickly enough that the tunable permeability layer 17 will be quenched in the amorphous state; i.e., the tunable permeability layer will revert from the crystalline state to an amorphous state. The parameters that can be optimized are the tunable permeability material, thicknesses of the layers, temperature of the chip, and amplitude and pulse shape of the heating pulse.

Figure 7:
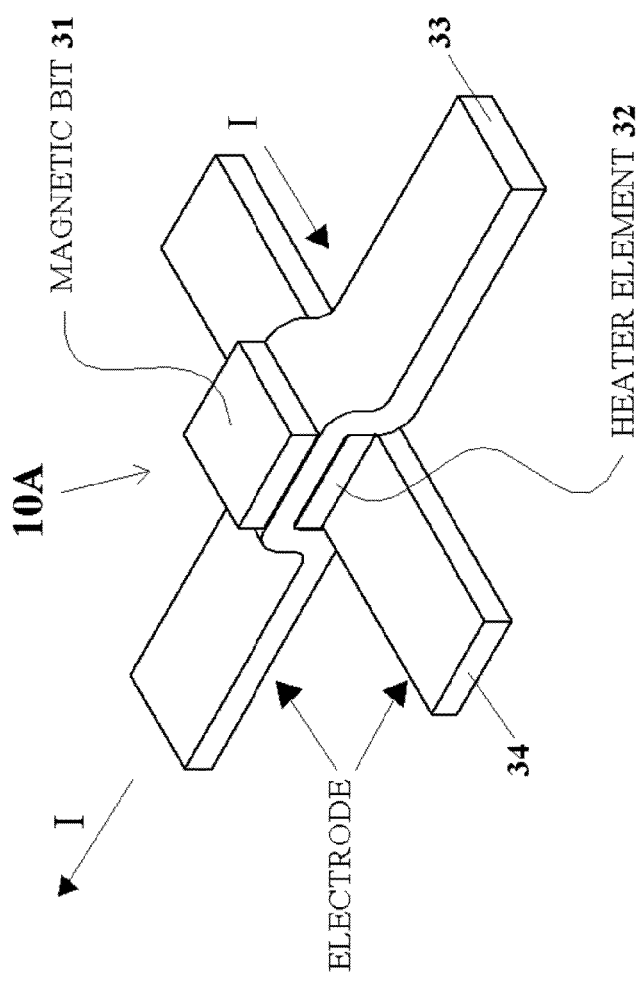
FIG. 7 is an alternate embodiment showing a multilayer structure in a 2-state device.

Referring now to FIG. 7, is an alternate embodiment. Shown in FIG. 7 is a magnetic layer or bit 31 composed of materials such as Metglas, a heater element 32, and electrodes 33 and 34. The chip containing the memory can be connected to external circuitry so that the bits can be written by ohmic heating using current pulses. Appropriate horizontal and vertical electrodes will pass the current through the heating element associated with a particular bit. By adjusting the magnitude of the current, one can raise the temperature of the soft magnetic material above its glass temperature. The time dependence of the pulse is also important. If the pulse turns off in millisecond, the soft magnetic material cools will crystallize and have a lower permeability. If the pulse turns off in microseconds, the soft magnetic material cools will revert to being amorphous and have a large permeability. The advantage of this approach is that one can setup a fabrication process to produce large numbers of identical, blank memory chips. Preparing large numbers of identical blank or unwritten chips will minimize the cost. The chips can then be written in a different lower cost system without the need of expensive lithography. This type of system that will be used for writing is similar to that already used in other magnetic memory systems. Once written, the chips can be read by using a magnetic tunnel junction reader or a spin transfer torque reader in a read head to measure how the bits modify the magnetic flux lines of a probe magnetic field. The read head is not part of the media and either the read head moves over the media or the media is moved under the read head. The difference in reading the bits from the prior art is that one needs a probe. Readers with the needed smaller dimensions have already been fabricated by many companies. There are alternative methods for writing the media or creating the tunable permeable layer 31. Specifically the media or tunable permeable layer 31 can be a bilayer of copper and nickel. In this case, heating the bilayer 31 will cause the copper and nickel to alloy and the resulting alloy will be non-magnetic. This approach will be used in creating a read only memory.

The percentage change in tunneling magneto resistance (TMR) will be measured by sweeping the reader. As an example, the reader may have a fly height d of 5 microns and the probe field $H_{probe}$=32 Oe. Smaller fly heights will be required for high density media.

FIGS. 8A and 8B illustrate a further alternate embodiment incorporating a spin valve construction. The alternate embodiment incorporates a spin valve as illustrated in FIGS. 8A and 8B. The electrodes 11A and 11B are used to measure the resistivity of the spin valve composed of the fixed ferromagnet 13, conductor 21, and reversible ferromagnet 15. The state of the tunable permeability layer 17 can be change by passing a current through the heating element 18 between electrodes 16 and 19. In this case the insulator of the magnetic tunnel junction is replaced by a nonmagnetic conductor 21. The polarization of the free layer 15 is changed by a applying a magnetic field via the conductor 23. The conductor 23 is spaced from the conductor 19 by an insulator 22. A larger field is required if the tunable layer 15 is hard. The same type truth table can be used as described above except that one that the current pulse in step B is replaced by applying a field that is large enough to switch the free layer 15 if the tunable layer 17 is soft. The layers 12 (antiferromagnetic pinning layer), 17 (tunable ferromagnetic layer) and 18 (the heater) and conductor 16 of the embodiment of FIGS. 8A and 8B are functionally the same as that discussed with respect to the embodiment illustrated in FIGS. 2, 3A, 3B.

The present invention includes methods for writing and reading nonerasable magnetic 40 nm bits with either a magnetic tunnel junction or a spin transfer oscillator.

In summary by adding layers, with possibly an alteration in the order of deposition, to a spin transfer torque (STT) RAM device, one can construct a four state memory. In the device, one of the states can be written into another state which is difficult to rewritten. Thus, the device is a combination of a STT RAM and a nonerasable magnetic memory.

As used herein, the terminology "permittivity" as it relates to electromagnetism, is the measure of the ability of a material to support the formation of a magnetic field within itself; the degree of magnetization that a material obtains in response to an applied magnetic field. In electromagnetism, the auxiliary magnetic field H represents how a magnetic field B influences the organization of magnetic dipoles in a given medium, including dipole migration and magnetic dipole reorientation, as shown by $$B = \mu H_s$$

where the permeability is represented by μ.

As used herein the terminology "anisotropy" means the property of being directionally dependent, as opposed to isotropy, which implies identical properties in all directions.

As used herein "Tunnel magnetoresistance (TMR)" is a magnetoresistive effect that occurs in a magnetic tunnel junction (MTJ).

As used herein, the terminology "magnetic tunnel junction" is a component consisting of two ferromagnets separated by a thin insulator; whereby by the tunnel magnetoresistance (TMR) is a measure of the ease that the electrons can tunnel through the insulating layer (typically a few nanometers thick), from one ferromagnet into the other. The junctions may be prepared by photolithography.

As used herein, the terminology "spin polarized current" relates to charge carriers (such as electrons) having a property known as spin which is a small quantity of angular momentum intrinsic to the carrier. An electrical current is generally unpolarized (consisting of 50% spin-up and 50% spin-down electrons); a spin polarized current is one with more electrons of either spin. By passing a current through a magnetic layer, one can produce a spin-polarized current. If a spin-polarized current is directed into a magnetic layer, angular momentum can be transferred to the layer, which will tend to change magnetization orientation. This can be used to excite oscillations or even flip the orientation of the magnetization.

As used herein, the terminology "anti-parallel" and "opposite" have the same meanings with respect to the magnetic polarity of the second ferromagnetic layer being substantially opposite to the magnetic polarity of the first ferromagnetic layer.

As used herein the terminology Metglas refers to a thin amorphous metal alloy ribbon often produced by using rapid solidification process of approx: 1,000,000° C./s. This rapid solidification creates an amorphous material with unique ferromagnetic properties that allows the ribbon to be magnetized and de-magnetized quickly and effectively with very low core losses of approximately 5 mW/kg at 60 Hz and maximum relative permeability approximately 1,000,000. In the present application, the Metglas can be produced by sputtering of alloys of the same compositions.

As used herein the terminology "exchange interaction" means, as defined in Wikipedia, an interaction between spins arises because the change in the direction of the spin leads to a change in electrostatic repulsion between neighboring electrons, due to a particular quantum mechanical effect called the exchange interaction. In a ferromagnet nearby spins tend to align in the same direction. The exchange interaction is related to the Pauli exclusion principle, which says that two electrons with the same spin cannot also have the same "position". Therefore, under certain conditions, when the orbitals of the unpaired outer valence electrons from adjacent atoms overlap, the distributions of their electric charge in space are further apart when the electrons have parallel spins than when they have opposite spins. This can reduce the electrostatic energy of the electrons when their spins are parallel compared to their energy when the spins are anti-parallel, so the parallel-spin state is more stable. In simple terms, the electrons, which repel one another, can move "further apart" by aligning their spins, so the spins of these electrons tend to line up. This difference in energy is called the exchange energy. Note that the direction of spin polarized current flow is the direction that the electrons are moving and is opposite to the direction of usual current flow.

The materials in which the exchange interaction is much stronger than the competing dipole-dipole interaction are frequently called magnetic materials. For instance, in iron (Fe) the exchange force is about 1000 times stronger than the dipole interaction. Therefore below the Curie temperature virtually all of the dipoles in a ferromagnetic material will be aligned. The exchange interaction is also responsible for the other types of spontaneous ordering of atomic magnetic moments occurring in magnetic solids, antiferromagnetism and ferrimagnetism. There are different exchange interaction mechanisms which create the magnetism in different ferromagnetic, ferrimagnetic, and antiferromagnetic substances. These mechanisms include direct exchange, RKKY exchange, double exchange, and superexchange.

Obviously, many modifications and variations of the present invention are possible in light of the above teachings. It is therefore to be understood that, within the scope of the appended claims, the invention many be practiced otherwise than as specifically described.

What is claimed is:

1. A memory device comprising an array of cells, each cell comprising:
    a first ferromagnetic layer with a fixed magnetic polarity;
    a second ferromagnetic layer with a magnetic polarity modifiable by a spin torque transfer current;
    at least one conductor operatively connected to the first and second ferromagnetic layers;
    a barrier layer between the first and second ferromagnetic layers forming a magnetic tunnel junction;
    a third ferromagnetic layer magnetically coupled to the second magnetic layer; the third magnetic layer having tunable permittivity;
    a heater element operatively associated with the third magnetic layer which selectively provides heat to the third ferromagnetic layer; the third ferromagnetic layer having a first permeable amorphous state; the third ferromagnetic layer capable of being heated to a second state which is crystalline to thereby decrease the permittivity of the third magnetic layer;
    whereby changes in the permittivity of the third magnetic layer effect the response of the second ferromagnetic layer to a spin polarized current.

2. The memory device of claim 1 further comprising a magnetic field probe and a detector of resistance to determine the states of the array of memory cells.

3. The memory device of claim 1 wherein the third magnetic layer comprises one of a Cu/Ni bilayers, Metglas, and alternating layers of copper and nickel.

4. The memory device of claim 1 wherein the array of cells are used to store data and each cell has four states, each state being determined by the magnetic polarities of the first and second ferromagnetic layers and the permittivity of the third ferromagnetic layer.

5. The memory device of claim 1 wherein if the magnetic polarities of the first and second ferromagnetic layers are antiparallel, the at least one conductor operatively connected to the first and second ferromagnetic layers provides a spin polarized current as the current passes through the first ferromagnetic layer and into the second ferromagnetic layer which provides a spin transfer torque current to the second ferromagnetic layer which causes the magnetic polarity of the second ferromagnetic layer to change from a first state of which is substantially antiparallel to the magnetic polarity of the first ferromagnetic layer to a second state which is substantially the same or parallel to the magnetic polarity of the first ferromagnetic layer.

6. The memory device of claim 1 wherein if the first and second ferromagnetic layers are parallel, the at least one conductor operatively connected to the first and second ferromagnetic layers provides a spin polarized current as the current passes through the second ferromagnetic layer and is partially reflected back into the second ferromagnetic layer which provides a spin transfer torque current to the second ferromagnetic layer which causes the magnetic polarity to change from a first state which is substantially parallel to the magnetic polarity of the first magnetic layer to a second state which is substantially opposite to the magnetic polarity of the first magnetic layer.

7. The memory device of claim 1 further comprising read circuitry operative to determine whether the modifiable magnetic polarity of the second ferromagnetic layer is substantially parallel to the magnetic polarity of the first ferromagnetic layer or is substantially opposite to the magnetic polarity of the first ferromagnetic layer.

8. The memory device of claim 7 wherein the read circuitry is operative to determine whether the third ferromagnetic layer is in a first highly permeable amorphous state or a second crystalline state.

9. The memory device of claim 7 wherein the at least one conductor comprises first and second conductors and wherein the read circuitry is operatively connected to the first and second conductors and wherein whether or not the magnetic polarity of the second ferromagnetic layer is substantially parallel to the magnetic polarity of the first ferromagnetic layer or substantially opposite to the magnetic polarity of the first ferromagnetic layer is determined by applying at least one pulse to the first and second conductors.

10. The memory device of claim 1 wherein the at least one conductor comprises first, second and third conductors and wherein the third magnetic layer comprises a ferromagnetic material and wherein permittivity of the third ferromagnetic layer is changed by changing the phase of the ferromagnetic material from substantially amorphous to crystalline by applying ohmic heating between the third conductor and the second conductor, and wherein whether or not the magnetic polarity of the second ferromagnetic layer is substantially parallel to the magnetic polarity of the first ferromagnetic layer or substantially opposite to the magnetic polarity of the first ferromagnetic layer is determined by applying at least one pulse to the first and second conductors and measuring the resistance.

11. The memory device of claim 10 where the array of cells are read by sending a plurality of current pulses to the memory cell via the first and second conductors, and sensing the resistance.

12. The memory device of claim 11 further comprising a voltage detector and wherein the memory cells have a plurality of memory states, the memory state of each cell being determined by transmitting a series of current pulses between the first and second conductors, and wherein if the resistance is low the magnetic polarity of the first and second ferromagnetic layers is substantially parallel in state and if the resistance is high then the magnetic polarity of the first and second ferromagnetic layers is substantially opposite.

13. The memory device of claim 12 wherein the memory cells have four states based upon whether the first and second ferromagnetic layers are parallel or antiparallel and whether the third ferromagnetic layer has a first permeable amorphous state or a second state which is crystalline; and wherein the state of the third ferromagnetic layer is determined by initiating pulses between the first and second conductors that are large enough to switch the second ferromagnetic layer if the third magnetic layer is in the first state but not if the third magnetic layer is it is in a second state.

14. The memory device of claim 12 the state of the third ferromagnetic layer is determined by initiating pulses between the first and second conductors that are large enough to switch the second ferromagnetic layer if the third magnetic layer is in a substantially amorphous state but not if the third magnetic layer is in a crystalline state.

15. An array of memory cells, each cell comprising
a first ferromagnetic layer with a fixed magnetic polarity;
a second ferromagnetic layer with a magnetic polarity modifiable by a spin torque transfer current;
at least one conductor operatively connected to the first and second ferromagnetic layer and adapted to be connected to a current source;
a third ferromagnetic layer magnetically coupled to the second magnetic layer; the third magnetic layer having permittivity which changes from a first state to a second state of lower permittivity upon heating; the second ferromagnetic layer being influenced by the permittivity of the third ferromagnetic layer whereupon application of a spin transfer torque current to the second ferromagnetic layer when the third ferromagnetic layer is in the second state will require a greater amount of spin transfer torque current to effectuate a change in the magnetic polarity of the second ferromagnetic layer than that which occurs when the third ferromagnetic layer is in the first state; and
a heater element operatively associated with the third magnetic layer which selectively provides heat to the third magnetic layer to change its permittivity.

16. The array of memory cells of claim 15 wherein the third ferromagnetic layer changes from the first state of permittivity to a second state of permittivity in which is the third ferromagnetic layer is substantially crystalline in structure.

17. The array of memory cells of claim 15 wherein the third ferromagnetic layer is in direct contact with the second ferromagnetic layer and affects the second ferromagnetic layer due to exchange interactions.

18. A memory device comprising an array of cells, each cell comprising:
a first ferromagnetic layer with a fixed magnetic polarity;
a second ferromagnetic layer with a magnetic polarity modifiable by a magnetic field; the second ferromagnetic layer being separated from the first ferromagnetic layer by a conductor layer;
at least one conductor operatively connected to the first and second ferromagnetic layers;
a third magnetic layer magnetically coupled to the second magnetic layer; the third magnetic layer having tunable permittivity;
a heater element operatively associated with the third magnetic layer which selectively provides heat to the third magnetic layer; the third magnetic layer having a first state that is a highly permeable amorphous state; the third layer capable of being heated to a second state which is crystalline to thereby decrease the permittivity of the third magnetic layer; the second ferromagnetic layer being influenced by the decrease in permittivity of the third magnetic layer such that application of larger magnetic field will be required to change the magnetic polarity of the second ferromagnetic layer when the third magnetic layer is in the second state than that needed when the third magnetic layer is in the first state.

19. A memory device of claim 18 wherein the first and second ferromagnetic layers with the conductor layer therebetween form a spin valve and wherein the state of the device is read by measuring the resistivity of the spin valve.

20. A nonvolatile memory comprising an array of cells, each cell comprising:
a ferromagnetic region having permittivity which changes from a first state to a second state of lower permittivity upon heating; each state representing a bit value;
a heater operatively associated with the ferromagnetic region which selectively provides heat to the third magnetic layer to change its permittivity; and
a plurality of conductors operatively connected to the heater and adapted to be connected to a current source that provides a current which causes the heater to emit heat to change the ferromagnetic region from the first state to the second state of lower permittivity to change the value of the bit.

* * * * *